United States Patent
Sung et al.

(10) Patent No.: US 6,417,049 B1
(45) Date of Patent: Jul. 9, 2002

(54) SPLIT GATE FLASH CELL FOR MULTIPLE STORAGE

(75) Inventors: Hung-Cheng Sung; Di-Son Kuo, both of Hsin-chu; Chia-Ta Hsieh; Yai-Fen Lin, both of Tainan, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/495,342

(22) Filed: Feb. 1, 2000

(51) Int. Cl.⁷ .......................................... H01L 21/8247
(52) U.S. Cl. ..................................... 438/266; 438/267
(58) Field of Search .................................. 438/257–267

(56) References Cited

U.S. PATENT DOCUMENTS

| 5,067,108 A | 11/1991 | Jenq | 365/185 |
| 5,098,855 A * | 3/1992 | Komori et al. | |
| 5,420,060 A | 5/1995 | Gill et al. | 437/52 |
| 5,440,158 A | 8/1995 | Sung-Mu | 257/314 |
| 5,508,955 A | 4/1996 | Zimmer et al. | 365/185.16 |
| 5,679,970 A | 10/1997 | Hartmann | 257/320 |

\* cited by examiner

*Primary Examiner*—Richard Booth
(74) *Attorney, Agent, or Firm*—George O. Saile; Stephen B. Ackerman

(57) ABSTRACT

In this invention polysilicon sidewalls on a semiconductor substrate are used as split gate flash memory cells. The sidewalls are formed around a core of silicon nitride and left standing once the silicon nitride is removed. Bit lines are implanted into the semiconductor substrate and extend partially under the sidewalls to allow the operation of the floating gates with respect to the buried bit line which act as drains and sources. A control gate is deposited over a row of sidewalls orthogonal to the bit lines and extending the length of a flash memory word line. The polysilicon sidewall split gate flash memory cells are programmed, read and erased by a combination of voltages applied to the control gate and the bit lines partially underlying the sidewalls.

5 Claims, 4 Drawing Sheets

|  | Voltages | | | |
| --- | --- | --- | --- | --- |
|  | Ctrl. Gate | BL-1 | BL-2 | Substr. |
| Program Cell (1) | 7 | 3 | 0 | 0 |
| Program Cell (2) | 7 | 0 | 3 | 0 |
| Erase Cells (1) & (2) | 0 | 7.5 | 7.5 | 0 |
| Read Cell (1) | 3 | 0 | 2 | 0 |
| Read Cell (2) | 3 | 2 | 0 | 0 |

*FIG. 3*

SPLIT GATE FLASH CELL FOR MULTIPLE STORAGE

BACKGROUND OF THE INVENTION

1. Field of Invention

This invention relates to semiconductor memories and in particular split gate flash memory cells.

2. Description of Related Art

Split gate flash memory technology requires a relatively large cell size compared to other type memory technologies. This is in part caused by misalignment problems and not being able to take advantage of self alignment techniques. Some designs of flash memory cells have multiple storage bits per each memory cell to accommodate the increased demand storage density, but this usually comes with an increased program current.

In U.S. Pat. No. 5,679,970 (Hartmann) a triple gate flash EPROM device is shown wherein two gate stacks each including a floating gate share a source with a control gate partially overlapping the gate stacks. In U.S. Pat. No. 5,508,955 (Zimmer et al.) is described a split gate EPROM cell with buried bit lines on either side of a storage cell. The source for the EPROM cell is in part a buried bit line on one side of the storage cell and the drain is in part a buried bit line on the other side of the cell In U.S. Pat. No. 5,440,158 (Sung-Mu) is shown an EPROM cell with dual sidewall floating gates. Source and drain regions are formed between and on either side of the floating gates and a control gate is formed over the floating gates. In U.S. Pat. No. 5,420,060 (Gill et al.) is shown a method for forming contact-free floating gate memory array with silicided buried bit lines and with a single step defined floating gates. In U.S. Pat. No. 5,067,108 (Jenq), an electrically conductive re-crystallized floating gate is disposed over an insulating area extending over a portion of a channel region and a drain region. A control gate partially overlaps the floating gate and extends over a portion of a source region.

With the demands for increased density for flash memory chips, it is important to create a small cell size that is easy to shrink, has multiple storage capability and requires proportionately small program current. The demand for increased density will require a solution to the misalignment problem in conventional split gate flash memories, and the minimizing of requirements for metalization and contact areas. To deal with the density requirement a cell architecture is required that has a plurality of floating gates with self alignment to produce source and drain areas that are in part a portion of buried bit lines and a control gate that extends beyond the cell to form in part a word line for the flash memory. Doing these items of improvement can produce an architecture for a split gate flash memory cell that will allow the cell to be reduced in size producing a higher flash memory density.

SUMMARY OF THE INVENTION

In this invention polysilicon sidewalls are used as floating gates for a flash memory. The sidewalls partially extend over ion implanted bit lines that operate as sources and drains in performing flash memory read, write and erase operations. Polysilicon control gates are formed over the sidewalls in an orthogonal orientation extending the length of a flash memory word line.

The polysilicon sidewalls are formed on the sides of silicon nitride blocks. Buried bit lines extending the length of a column of silicon nitride blocks are ion implanted between columns of silicon nitride blocks using the silicon nitride blocks with the polysilicon sidewalls as a mask. The buried bit lines are implanted between columns of silicon nitride blocks with the polysilicon sidewalls. The bit line implanted between adjacent columns of silicon nitride blocks extends the length of a flash memory column and lie partially under the sidewalls attached to the silicon nitride blocks which are located on either side of the implanted bit lines.

Once the bit lines are implanted, the silicon nitride blocks are removed leaving two polysilicon sidewalls on opposite sides of the removed silicon nitride blocks. The two polysilicon sidewalls are separated by the space left by the removed silicon nitride block and form a part of two columns of flash memory cells that are independent of each other. The polysilicon sidewalls are insulated with a dielectric layer and a control gate is formed over the sidewalls orthogonal to the buried bit lines and extending the length of a word line of the flash memory.

At each site of the silicon nitride blocks there are two polysilicon sidewalls left standing once the silicon nitride blocks have been removed. The sidewalls are used as floating gates and form two independent flash memory cells. A first of the two sidewalls (hereafter called "cell 1") partially covers a first bit line, and the second of the two sidewalls (hereafter called "cell 2") partially covers a second bit line. One of the two bit lines at each site acts as a source and the other a drain, and each bit line is shared with a sidewall cell at an adjacent site.

Cell 1 is programmed by applying a first positive voltage to the control gate overlaying the row of cells containing cell 1 and cell 2. A second positive voltage is applied to the bit line (hereafter called "bit line 2") running under the edge of the sidewall forming cell 2, and zero volts is applied to the bit line 1 running under the edge of the sidewall forming cell 1 (hereafter called "bit line 1"). Bit line 2 acts like a source supplying source side hot carriers to program a charge onto the floating gate of cell 1. Cell 2 is programmed by applying the same first positive voltage to the control gate as used for cell 1. The same second positive voltage is applied to bit line 1 running under the edge of the sidewall forming cell 1, and zero volts is applied to bit line 2. Bit line 1 acts like a source supplying source side hot carriers to program a charge onto the floating gate of cell 2.

To read cell 1, a third positive voltage less in magnitude than the first positive voltage is applied to the control gate. A fourth positive voltage less in magnitude than the third positive voltage is applied to bit line 2 acting as a drain, and bit line 1 is connected to zero volts through a sense amplifier. To read cell 2 the third positive voltage is applied to the control gate. The fourth positive voltage is applied to bit line 1 acting as a drain; and bit line 2 is connected to zero volts through a sense amplifier. To erase cells 1 and 2 a fifth positive voltage greater then the first positive voltage and high enough in amplitude to invoke Fowler-Nordheim tunneling is applied to bit line 1 and 2 with circuit ground connected to the control gate. .

BRIEF DESCRIPTION OF THE DRAWINGS

This invention will be described with reference to the accompanying drawings, wherein:

FIG. 3 is a table showing applied voltages necessary to program read and erase the split gate flash memory of this invention.

DETAILED DESCRIPTION OF THE PREFERRED EMBODIMENT

Figure 1A:
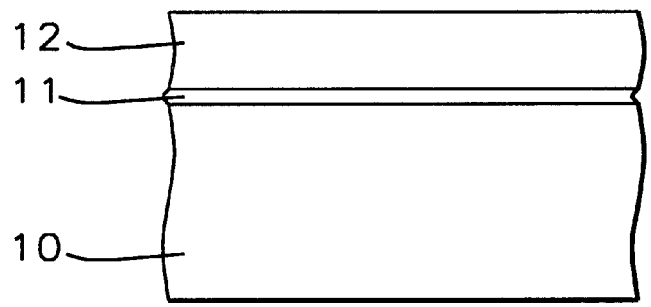
FIG. 1a through 1f are diagrams showing the process for constructing the split gate flash cell of this invention.
Figure 1B:
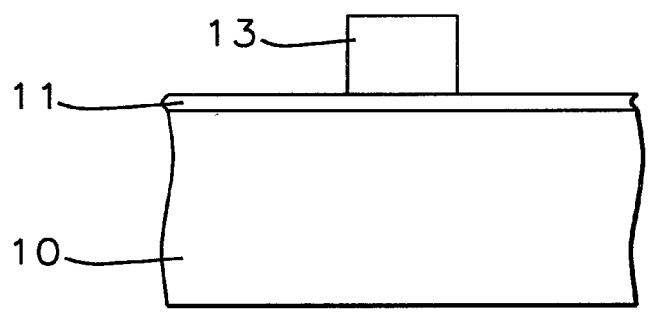
Figure 1C:
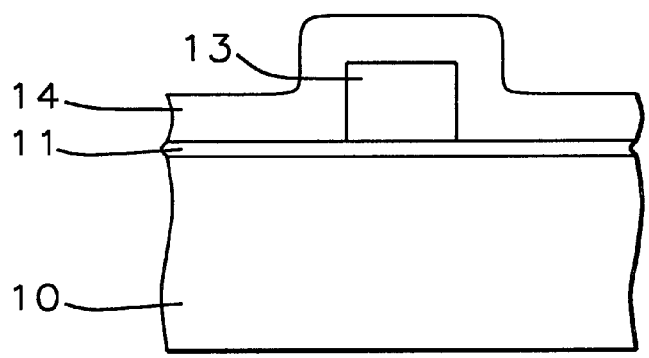
Figure 1D:
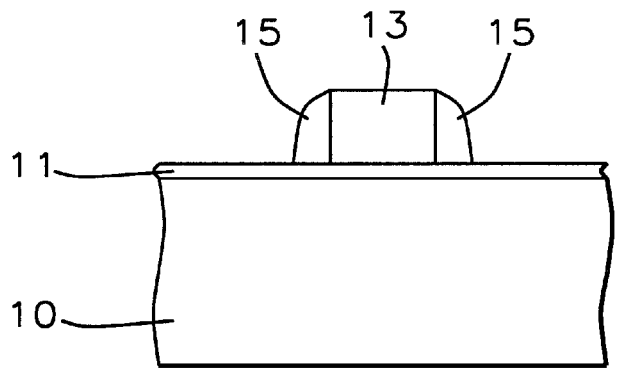

In FIG. 1a through FIG. 1f are shown steps in the process to create a spit gate flash cell using polysilicon sidewalls as storage cells. In FIG. 1a is shown a P substrate 10 upon which is layer of silicon oxide 11. A layer of silicon nitride 12 is deposited on top of the layer of silicon oxide 11. The silicon nitride is patterned and etched to form rows and columns of silicon nitride blocks 13 as shown in FIG. 1b. The substrate 10 is subjected to an oxide dip and a tunnel oxide growth to produce a nominal thickness of approximately about 90 Angstroms around the periphery of the silicon nitride block 13 and having a range approximately between 80 Angstroms maximum and 100 Angstroms minimum. The surface of the substrate 10 including the silicon nitride block 13 is covered with a coating of polysilicon 14 as shown in FIG. 1c, and the polysilicon 14 is anisotropically etched to form polysilicon sidewalls 15 around the silicon nitride block 13 as shown in FIG. 1d. The polysilicon 14 is etched with a gas mixture of He as an inert gas and HBr, $Cl_2$ and $O_2$ active gasses. The pressure of the gas in the etching chamber is preferably 0.5–5 mTorr.

Figure 1E:
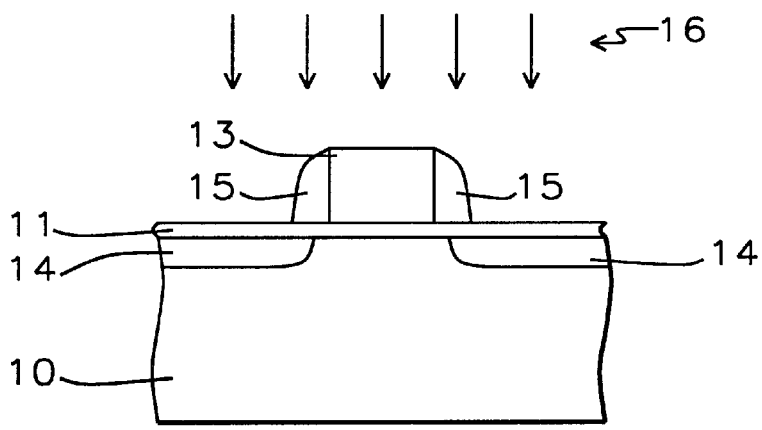

Once the polysilicon sidewalls 15 have been formed, a phosphorous ion implantation 16, shown in FIG. 1e, is used to implant buried bit lines 14 using the silicon nitride blocks 13 and the polysilicon sidewalls 15 as masks to allow for self alignment. The implanted bit lines have a depth of preferably about 0.25 um and in a range between approximately about 0.2 um minimum and 0.3 um maximum. The width of the bit lines 14 is between approximately about 0.2 um and 0.4 um. An ion dosage of preferably about $3 \times 10^{15}$ $ions/cm^2$ and in a range of between about $2 \times 10^{15}$ $ions/cm^2$ and $4 \times 10^{15}$ $ions/cm^2$ at an energy of preferably about 20 kev and between about 10 Kev and 30 kev.

Figure 1F:
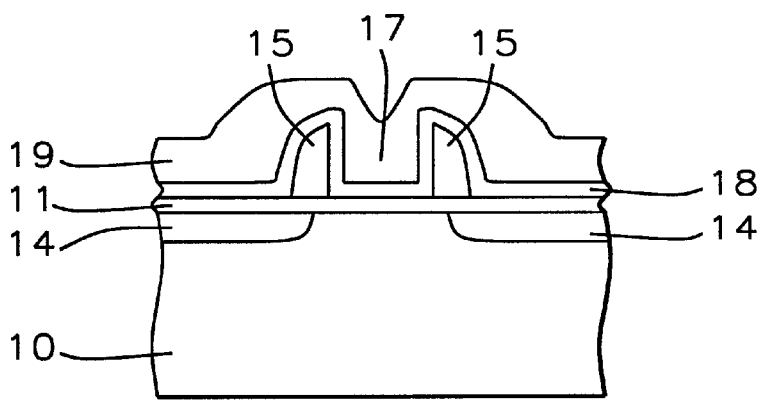

In FIG. 1f the silicon nitride block 13 is removed leaving a void 17 between the sidewalls 15. An ONO (oxide-nitride-oxide) coating 18 is formed over the surface of the substrate covering the sidewalls 15. Then polysilicon is deposited on the surface of the substrate to form control gates 19 by means of patterning and etching. The control gates form word lines for the flash memory and each control gate extends orthogonal to the bit lines across the flash memory to form a wordline. Once the polysilicon control gates 19 are formed, peripheral devices are formed, interlevel dielectric is deposited, electrical contact holes are opened and metalization is patterned on the substrate to interconnect devices.

Figure 2A:
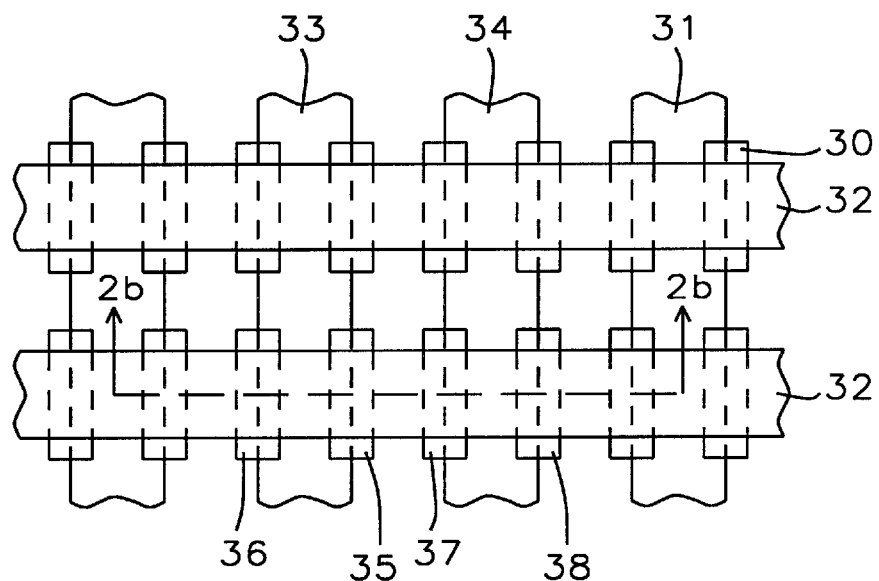
FIG. 2a is a plan view of a portion of the flash memory array.
Figure 2B:
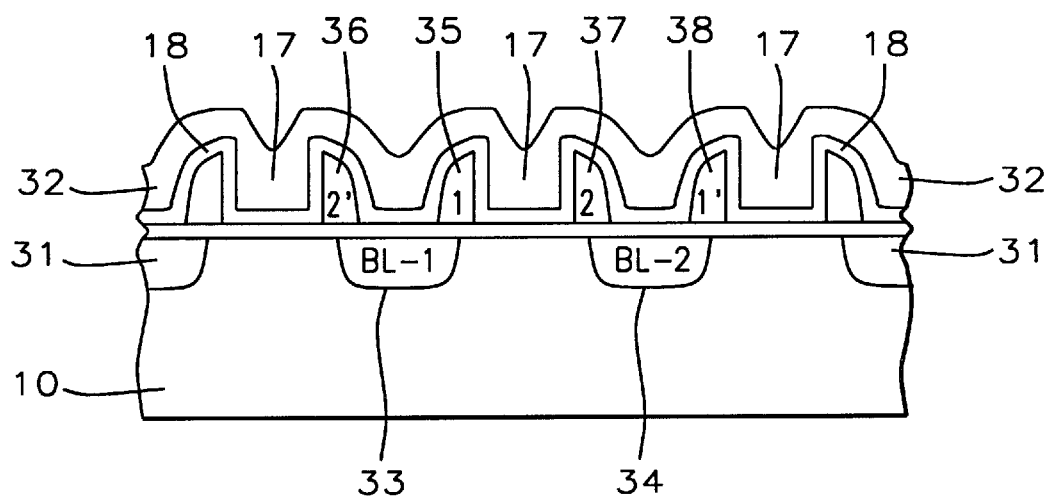
FIG. 2b is a cross sectional view of the flash memory array.

Referring to FIG. 2a and FIG. 2b, a plan view and a cross section view of a portion of the split gate flash memory of this invention is shown. A plurality of buried bit lines 31 and including 33 and 34 have been N+ ion implanted into a P type semiconductor substrate 10 extending under a portion of a plurality of polysilicon sidewalls 30 and including 35, 36, 37 and 38 located on both sides of the buried bit lines 31, 33 and 34. A plurality of polysilicon control gates 32 extending the length of a word line of the flash memory are deposited over an ONO coating 18 and orthogonal to the plurality of polysilicon sidewalls represented by 30, 35, 36, 37 and 38. The space 17 between adjacent polysilicon sidewalls represented by 35 and 37 is the location of the removed silicon nitride block 13 and is now filled with material of the polysilicon control gate 32 used as a word line for the flash memory.

Continuing to refer to FIG. 2b, bit line (BL-1) 33 is lying under a portion of polysilicon sidewall 36 and polysilicon sidewall 35 where the two sidewalls are located on opposite sides of the buried bit line (BL-1) 33. The polysilicon sidewall 36 forms the split gate flash memory cell (2') and the polysilicon sidewall 35 forms the split gate flash memory cell (1). Similarly bit line (BL-2) 34 is lying under a portion of polysilicon sidewall 37 and polysilicon sidewall 38 where the two sidewalls are located on opposite sides of the buried bit line (BL-2) 34. The polysilicon sidewall 37 forms the split gate flash memory cell (2) and the polysilicon sidewall 38 forms the split gate flash memory cell (1'). During read and write operations the control gate 32 extending the length of a word line of the flash memory is activated with an applied voltage, and bit lines represented by (BL-1) 33 and (BL-2) 34 are alternatively used as a source and a drain to read a charge from and write a charge onto the flash memory cells (1) 35 and (2) 37.

Referring to FIG. 3 and continuing to refer to FIG. 2b, a table of voltages is shown in FIG. 3 necessary to read, write and erase the flash memory cells (1) 35 and (2) 37 shown in FIG. 2b. To erase memory cells (1) and (2) the control gate voltage is set to $V_{GC}$=0V and the voltage on bit lines BL-1 and BL-2 is set to $V_{BL1}$=7.5V and $V_{BL2}$=7.5V. The voltage on the two bit lines BL-1 and BL-2 is sufficient in magnitude to invoke Fowler-Nordheim tunneling and remove any charge stored on the two split gates (1) 35 and (2) 37. To program split gate flash cell memory (1) the control gate 32 voltage is set at $V_{CG}$=7V, bit line (BL-1) 33 acting as a drain is connected to $V_{BL1}$=3V and bit line (BL-2) 34 acting as a source is connected to $V_{BL2}$=0V. Hot carriers flowing from the source to the drain are induced into the sidewall split gate memory cell (1) 35 to produce a programmed charge that remains on cell (2) until it is erased using Fowler-Nordheim tunneling. To program split gate flash memory cell (2) the control gate 32 voltage is set at $V_{CG}$=7V, bit line (BL-2) 34 acting as a drain is connected to $V_{BL2}$=3V and bit line (BL-1) 33 acting as a source is connected to $V_{BL1}$=0V. Hot carriers flowing from the source to the drain are induced into the sidewall split gate memory cell (2) 37 to produce a programmed charge that remains on cell (2) until it is erased using Fowler-Nordheim tunneling.

Continuing to refer to FIG. 2b and FIG. 3, memory cell (1) 35 is read by applying a voltage $V_{GC}$=3V to the control gate 32, connecting bit line (BL-1) 33 acting as a source to $V_{BL1}$=0V though a sense amplifier and connecting bit line (BL-2) 34 acting as a drain to $V_{BL2}$=2V. To read memory cell (2) 37 the function of the bit lines (BL-1) 33 and (BL-2) 34 are reversed. Bit line (BL-2) 34 acts as a source and is connected to $V_{BL2}$=0V through a sense amplifier and bit line (BL-1) 33 acts as a drain and is connected to $V_{BL1}$=2V.

Continuing to refer to FIG. 2b and FIG. 3, other sidewall split gate flash memory cells, such as (1') 38 and (2') 36 are programmed, erased and read in a similar way using a control gate to select the word line and a pair of bit lines to act as a source and a drain to select the cell to be read or written. The split gate memory cells on the opposite sides of a shared bit line react to the bit line in an opposite manner. As an example, bit line (BL-1) 33 is shared by memory cells (1) 35 and (2') 36, and bit line (BL-2) 34 is shared by memory cells (2) 37 and (1') 38. Memory cell (2') 36 is programmed and read using voltages in the same fashion as memory cell (2) in FIG. 3 which is opposite to the voltages used for programming and reading memory cell (1). Similarly, memory cell (1') 38 is programmed and read using voltages in the same fashion as memory cell (1) in FIG. 3 which is opposite to the voltages used for programming and reading memory cell (2).

While the invention has been particularly shown and described with reference to preferred embodiments thereof, it will be understood by those skilled in the art that various changes in form and details may be made without departing from the spirit and scope of the invention.

What is claimed is:

1. A method for producing a split gate multiple storage flash cell, comprising:
    a) forming a silicon nitride layer on a semiconductor substrate covering a thin silicon oxide layer,
    b) patterning and etching said silicon nitride layer to form areas of silicon nitride on the surface of said substrate in rows and columns,
    c) oxide dipping of said substrate and growing tunnel oxide,
    d) depositing a first layer of polysilicon over the surface of said substrate,
    e) etching said first layer of polysilicon to form sidewall spacers on said areas of silicon nitride,
    f) patterning and ion-implanting buried bit lines in columns between adjacent areas of silicon nitride, wherein said buried bit lines function as sources and drains for split gate flash memory cells,
    g) removing said silicon nitride,
    h) depositing ONO (oxide-nitride-oxide) over the surface of said substrate,
    i) depositing a second layer of polysilicon over the ONO on the surface of said substrate,
    j) patterning and etching said second layer of polysilicon to form word lines, wherein each said word line connects together control gates in a row of said split gate flash memory cells,
    k) forming sources and drains for peripheral devices,
    l) forming inter-layer dielectric,
    m) patterning and depositing interconnecting metal vias and lines.

2. The method of claim 1, wherein patterning and etching areas of silicon nitride produces sites for said split gate flash memory cells.

3. The method of claim 1, wherein etching said first layer of polysilicon to form sidewall spacers creates a floating gate structure for said split gate flash memory cells.

4. The method of claim 1, wherein patterning and implanting buried bit lines forms bit lines that run partially beneath said sidewall spacers located on adjacent edges of said adjacent areas of silicon nitride.

5. The method of claim 1, wherein patterning and etching said second layer of polysilicon forms a plurality of word lines that connect together a plurality control gates of said split gate flash memory cells on each word line.

* * * * *

UNITED STATES PATENT AND TRADEMARK OFFICE
CERTIFICATE OF CORRECTION

PATENT NO.    : 6,417,049 B1                                            Page 1 of 1
DATED         : July 9, 2002
INVENTOR(S)   : Hung-Cheng Sung et al.

It is certified that error appears in the above-identified patent and that said Letters Patent is hereby corrected as shown below:

<u>Title page,</u>
Item [75], Inventors, please delete "Chia-Ta Hsieh; Yai-Fen Lin, both of Tainan", and replace with -- Chia-Ta Hsieh, Taiwan; Yai-Fen Lin, Hsin-Chu --.

Signed and Sealed this

Fourth Day of February, 2003

JAMES E. ROGAN
*Director of the United States Patent and Trademark Office*